(12) United States Patent
Weis

(10) Patent No.: US 8,130,537 B2
(45) Date of Patent: Mar. 6, 2012

(54) PHASE CHANGE MEMORY CELL WITH MOSFET DRIVEN BIPOLAR ACCESS DEVICE

(75) Inventor: Rolf Weis, Dresden (DE)

(73) Assignee: Qimonda AG, Munich (DE)

( * ) Notice: Subject to any disclaimer, the term of this patent is extended or adjusted under 35 U.S.C. 154(b) by 798 days.

(21) Appl. No.: 12/207,229

(22) Filed: Sep. 9, 2008

(65) Prior Publication Data
US 2010/0061145 A1    Mar. 11, 2010

(51) Int. Cl.
*G11C 11/00* (2006.01)
*H01L 21/00* (2006.01)
*H01L 47/00* (2006.01)

(52) U.S. Cl. ......................................... 365/163

(58) Field of Classification Search .................. 365/163, 365/148, 174; 257/370, 373, 378; 438/102
See application file for complete search history.

(56) References Cited

U.S. PATENT DOCUMENTS 7,811,879 B2 * 10/2010 Lam et al. ...................... 438/234
2007/0126064 A1 * 6/2007 Pellizzer et al. ............... 257/378
* cited by examiner

*Primary Examiner* — Alexander Sofocleous
*Assistant Examiner* — Hai Pham
(74) *Attorney, Agent, or Firm* — John S. Economou

(57) ABSTRACT

Embodiments are directed to memory devices comprising a bipolar junction transistor having an emitter, a base and a collector; a first side of a resistance changing memory element coupled to the emitter of the bipolar junction transistor; and a MOSFET coupled to the base of the bipolar junction transistor.

21 Claims, 7 Drawing Sheets

PHASE CHANGE MEMORY CELL WITH MOSFET DRIVEN BIPOLAR ACCESS DEVICE

CROSS-REFERENCE TO RELATED APPLICATIONS

This application relates to the following co-pending and commonly assigned patent applications: U.S. patent application Ser. No. 12/033,519, filed Feb. 19, 2008, entitled "Integrated Circuit Including U-Shaped Access Device;" and U.S. patent application Ser. No. 12/033,533, filed Feb. 19, 2008, entitled "Integrated Circuit Including U-Shaped Access Device," which applications are hereby incorporated herein by reference.

TECHNICAL FIELD

The present invention relates generally to phase change memory devices comprising MOSFET driven bipolar transistors.

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a pattern of voltage pulses or a current pulse or a pattern of current pulses to the memory element.

One type of resistive memory is phase change memory (PCRAM). Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state—"set"—and from the crystalline state to the amorphous state—"reset"—in response to temperature changes. The temperature changes of the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse or a pattern of pulses that is applied to the phase change material. The temperature in the phase change material in each memory cell generally corresponds to the applied level of current and/or voltage to achieve the heating.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

Higher density phase change memories can also be achieved by reducing the physical size of each memory cell. Increasing the density of a phase change memory increases the amount of data that can be stored within the memory while at the same time typically reducing the cost of the memory. A relatively high current is used to reset a phase change memory cell. The access device used to access a phase change memory cell has to be capable of providing the high current. The high current can most efficiently (i.e., with the smallest memory cell size) be provided by a bipolar device such as a diode. Diodes are typically fabricated after transistor formation using a selective epitaxy process, which requires an ultra-high vacuum chemical vapor deposition (UHV-CVD) tool to meet the temperature budget requirements.

Bipolar memory arrays are typically used to provide the high current densities required to drive set and reset currents in PCRAM devices. In such bipolar memory arrays, the wordlines are pulled up to high voltage until a read or write operation occurs. During a read or write operation, a selected wordline is pulled to ground. Current leakage over the base diodes in bipolar memory arrays limits the number of open arrays. Additionally, such bipolar memory arrays require relatively large amounts of power.

SUMMARY OF THE INVENTION

These and other problems are generally solved or circumvented, and technical advantages are generally achieved, by preferred embodiments of the present invention in which an integrated circuit includes a first contact, a second contact, and a U-shaped access device coupled to the first contact and the second contact. The integrated circuit includes self-aligned dielectric material isolating the first contact from the second contact.

In one embodiment, a memory device comprises a bipolar junction transistor having an emitter, a base and a collector. A first side of a resistance changing memory element is coupled to the emitter of the bipolar junction transistor. A metal-oxide-semiconductor field-effect transistor (MOSFET) is coupled to the base of the bipolar junction transistor. A bit line is coupled to a second side of the resistance changing memory element. A word line operates as the gate of the MOSFET. The MOSFET may be an n-channel MOSFET, and the bipolar junction transistor may be a PNP transistor. Alternatively, the MOSFET may be a p-channel MOSFET, and the bipolar junction transistor may be an NPN transistor.

In another embodiment, a memory device comprises a resistance changing memory element coupled to a first side of a U-shaped access device. The U-shaped access device further comprises a doped first region having a first polarity; a doped second region disposed above the first region, the doped second region having a second polarity; a doped third region disposed above a first portion of the second region, the third region having the first polarity; a doped fourth region disposed above the third region, the fourth region having the second polarity; and a doped fifth region disposed above a second portion of the second region, the fourth region having the first polarity. The memory device may further comprises a heavily doped sixth region disposed above the fifth region, the sixth region having the first polarity.

The first, third, and fifth regions may be p-doped regions, and the second and fourth regions may be n-doped regions. A ground line may be coupled to the first region and/or to the fourth region. A phase changing element may be coupled to the sixth region, and a bit line may be coupled to the phase changing element. A word line may be formed near the third region and separated from the third region by a dielectric material. The first, second and fifth regions form a bipolar junction transistor; and the second, third and fourth regions and the word line form a MOSFET transistor. The bipolar junction transistor may be a PNP transistor, and the MOSFET transistor may be an n-channel MOSFET transistor.

In one embodiment, the memory device further comprises a word line formed near the third region, wherein the word line is separated from the third region by a dielectric material, a phase changing element coupled to the fifth region, a bit line coupled to the phase change region, and, when a voltage is applied to the word line, a current flows from the bit line to the first region through the phase change element. The second region may be lightly doped and the fourth region heavily doped.

In another embodiment, a method for fabricating an integrated circuit, comprises doping a first region of a substrate to have a first polarity; lightly doping a second region of the substrate to have a second polarity, a bottom of the second region contacting a top of the first region; doping a third region of the substrate to have the first polarity, a bottom of the third region contacting a first portion of a top of the second region; heavily doping a fourth region to have the second polarity, a bottom of the fourth region contacting a top of the third region; doping a fifth region of the substrate to have the first polarity, a bottom of the fifth region contacting a second portion of the top of the second region; and heavily doping a sixth region to have the first polarity, a bottom of the sixth region contacting a top of the fifth region. The third and fourth regions may be isolated from the fifth and sixth regions. The fabricating may further comprise fabricating a bipolar transistor in a silicon substrate, and fabricating a MOSFET transistor in the silicon substrate. The fabricating may comprise fabricating a phase change element on a top of the sixth region; fabricating a first line coupled to phase change element; and fabricating a second line coupled to the third region.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF ILLUSTRATIVE EMBODIMENTS

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
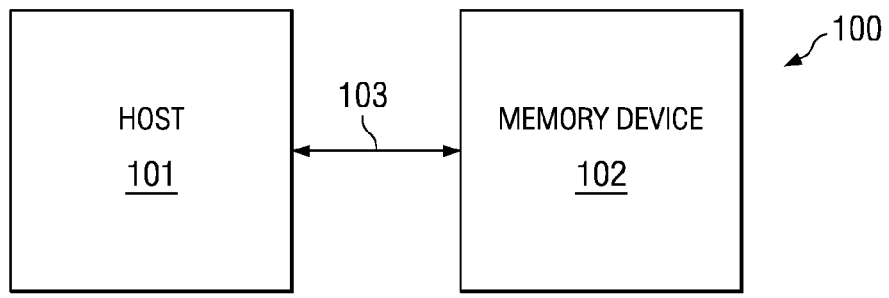
FIG. 1 is a block diagram illustrating one embodiment of a system using a memory device, such as a PCRAM memory device.

FIG. 1 is a block diagram illustrating one embodiment of a system 100, which includes a host 101 and a memory device 102. Host 101 is communicatively coupled to memory device 102 through communication link 103. Host 101 may include a microprocessor, computer (e.g., desktop, laptop, handheld), portable electronic device (e.g., cellular phone, personal digital assistant (PDA), MP3 player, video player, digital camera), or any other suitable device that uses memory. Memory device 102 provides memory for host 101. In one embodiment, memory device 102 provides embedded memory for host 101 and host 101 and memory device 102 are included on a single integrated circuit or circuit board. In one embodiment, memory device 102 includes a phase change memory device or other suitable resistive or resistivity changing material memory device.

Figure 2:
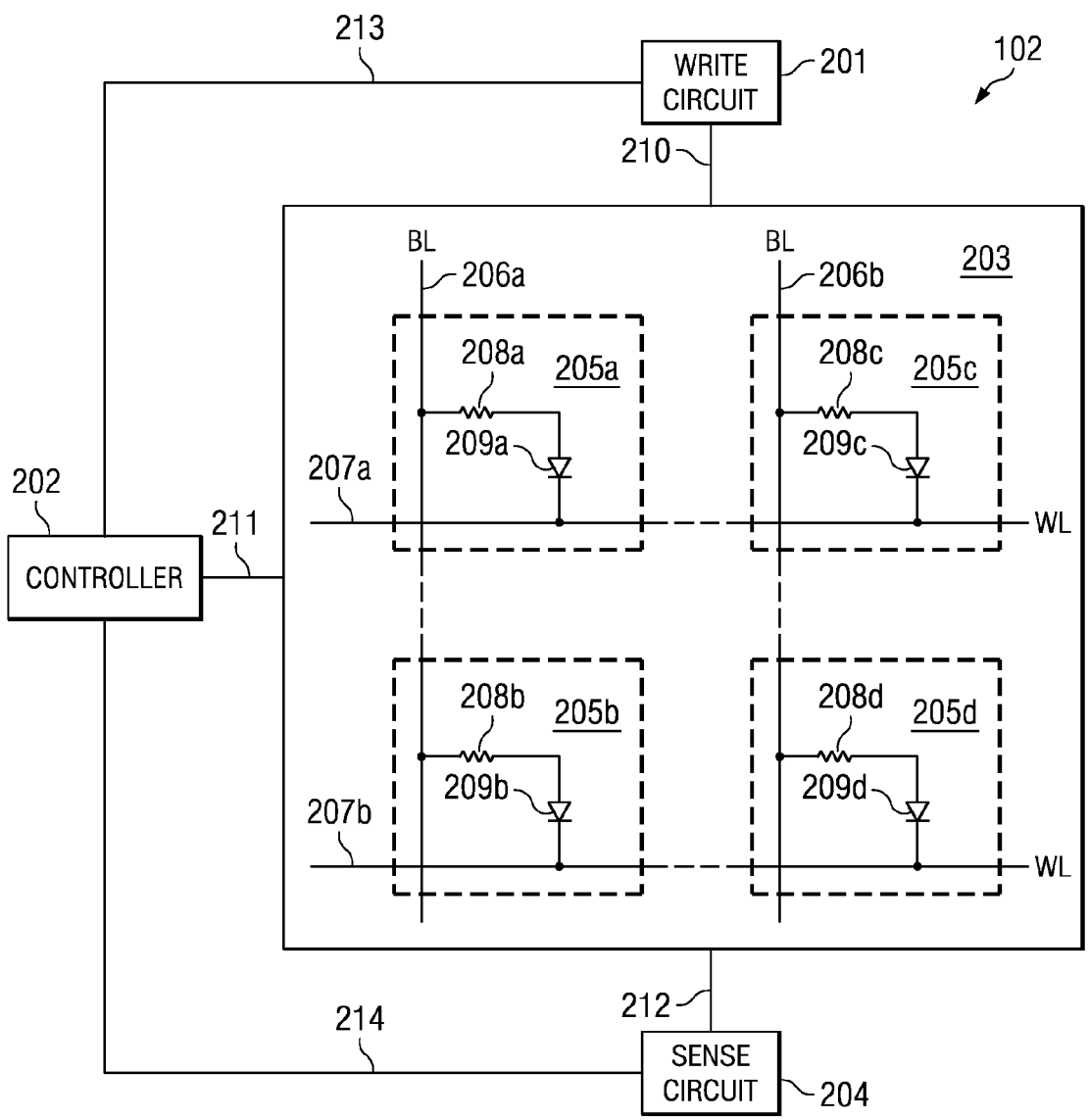
FIG. 2 is a diagram illustrating one embodiment of a memory device.

FIG. 2 is a diagram illustrating one embodiment of memory device 102. Such a memory device is disclosed in the above-identified U.S. patent application Ser. Nos. 12/033,519 and 12/033,533. Memory device 102 includes a write circuit 201, a controller 202, a memory array 203, and a sense circuit 204. Memory array 203 includes a plurality of resistive memory cells 205a-205d (collectively referred to as resistive memory cells 205), a plurality of bit lines (BLs) 206a-206b (collectively referred to as bit lines 206), and a plurality of word lines (WLs) 207a-207b (collectively referred to as word lines 207). In one embodiment, resistive memory cells 205 are phase change memory cells. In other embodiments, resistive memory cells 205 may be any other suitable type of resistive memory cells or resistivity changing memory cells.

Each memory cell 205 includes a phase change element 208 and a diode 209. Diodes 209 may be U-shaped and formed in a silicon on insulator (SOI) substrate or local SOI structures between isolation regions. As used herein, the term "U-shaped" includes any substantially U, J, or backward J shape. In another embodiment, diodes 209 are replaced by bipolar transistors. The bipolar transistors may be U-shaped and formed in a substrate having a common potential, such as ground. The bipolar transistors may be formed between isolations regions such that one side of each bipolar transistor is coupled to common or ground. Therefore, the bipolar transistors function similarly to diodes. Diodes 209 may be fabricated without selective epitaxy, which requires the use of an ultra-high vacuum chemical vapor deposition (UHV-CVD) tool to meet the temperature budget requirements.

As used herein, the term "coupled" is not meant to mean that the elements must be directly coupled together. Intervening elements may be provided between electrically coupled elements, or elements may be field-coupled.

Memory array 203 is electrically coupled to write circuit 201 through signal path 210, to controller 202 through signal path 211, and to sense circuit 204 through signal path 212. Controller 202 is electrically coupled to write circuit 201 through signal path 213 and to sense circuit 204 through signal path 214. Each phase change memory cell 205 is electrically coupled to a word line 207 and a bit line 206. For example, phase change memory cell 205a is electrically coupled to bit line 206a and word line 207a.

Each phase change memory cell 205 includes a phase change element 208 and a diode 209. For example, phase change memory cell 205a includes phase change element 208a and diode 209a. One side of phase change element 208a is electrically coupled to bit line 206a, and the other side of phase change element 208a is electrically coupled to one side of diode 209a. The other side of diode 209a is electrically coupled to word line 207a. In another embodiment, the polarity of diode 209a may be reversed.

In another embodiment, each phase change element 208 may be electrically coupled to a word line 207 and each diode 209 electrically coupled to a bit line 206. For example, for phase change memory cell 205a, one side of phase change element 208a may be electrically coupled to word line 207a. The other side of phase change element 208a electrically coupled to one side of diode 209a. The other side of diode 209a electrically coupled to bit line 206a.

In one embodiment, each phase change element 208 comprises a phase change material that may be made up of a variety of materials. Generally, chalcogenide alloys that contain one or more elements from Group VI of the periodic table are useful as such materials. In one embodiment, the phase change material is made up of a chalcogenide compound material, such as GeSbTe, SbTe, GeTe, or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

Each phase change element 208 may be changed from an amorphous state to a crystalline state or from a crystalline state to an amorphous state under the influence of temperature change. The amount of crystalline material coexisting with amorphous material in the phase change material of one of the phase change elements thereby defines two or more states for storing data within memory device 102. In the amorphous state, a phase change material exhibits significantly higher resistivity than in the crystalline state. Therefore, the two or more states of the phase change elements differ in their electrical resistance. In one embodiment, the two or more states are two states and a binary system is used, wherein the two states are assigned bit values of "0" and "1". In another embodiment, the two or more states are three states and a ternary system is used, wherein the three states are assigned bit values of "0", "1", and "2". In another embodiment, the two or more states are four states that are assigned multi-bit values, such as "00", "01", "10", and "11". In other embodiments, the two or more states can be any suitable number of states in the phase change material of a phase change element.

Controller 202 may include a microprocessor, microcontroller, or other suitable logic circuitry for controlling the operation of memory device 102. Controller 202 controls read and write operations of memory device 102 including the application of control and data signals to memory array 203 through write circuit 201 and sense circuit 204. In one embodiment, write circuit 201 provides voltage pulses through signal path 210 and bit lines 206 to memory cells 205 to program the memory cells. In other embodiments, write circuit 201 provides current pulses through signal path 210 and bit lines 206 to memory cells 205 to program the memory cells.

Sense circuit 204 reads each of the two or more states of memory cells 205 through bit lines 206 and signal path 212. In one embodiment, to read the resistance of one of the memory cells 205, sense circuit 204 provides current that flows through one of the memory cells 205. Sense circuit 204 then reads the voltage across that one of the memory cells 205. In another embodiment, sense circuit 204 provides voltage across one of the memory cells 205 and reads the current that flows through that one of the memory cells 205. In another embodiment, write circuit 201 provides voltage across one of the memory cells 205 and sense circuit 204 reads the current that flows through that one of the memory cells 205. In another embodiment, write circuit 201 provides current that flows through one of the memory cells 205 and sense circuit 204 reads the voltage across that one of the memory cells 205.

In one embodiment, during a set operation of phase change memory cell 205a, for example, one or more set current or voltage pulses are selectively enabled by write circuit 201 and sent through bit line 206a to phase change element 205a, thereby heating phase change element 208a above its crystallization temperature (but usually below its melting temperature). In this way, phase change element 208a reaches its crystalline state or a partially crystalline and partially amorphous state during this set operation.

During a reset operation of phase change memory cell 205a, for example, a reset current or voltage pulse is selectively enabled by write circuit 201 and sent through bit line 206a to phase change element 208a. The reset current or voltage quickly heats phase change element 208a above its melting temperature. After the current or voltage pulse is turned off, phase change element 208a quickly quench cools into the amorphous state or a partially amorphous and partially crystalline state.

Phase change memory cells 205a-d and other phase change memory cells 205 (not shown) in memory array 203 are set and reset in a manner similar to that described above with respect to phase change memory cell 205a using similar current or voltage pulses. In other embodiments, for other types of resistive memory cells, write circuit 201 provides suitable programming pulses to program the resistive memory cells 205 to the desired state.

It is known, such as in the above-referenced application Ser. Nos. 12/033,519 and 12/033,533, to use bipolar PNP transistors to form diodes 209. In one embodiment, the base of the PNP transistor is coupled to word line 207. The PNP transistor is triggered when its base is pulled to low voltage or ground. Accordingly, in such as system, word line 207 is held at high voltage until a read or write action occurs. As a result, unselected word lines are maintained at high voltage resulting in high power consumption.

Embodiments of the present invention provide a system and method in which a device is placed in the word line path to invert operation of the memory array wherein the word line must be pulled up to high voltage to trigger the NPN transistor in diode 209.

Figure 3:
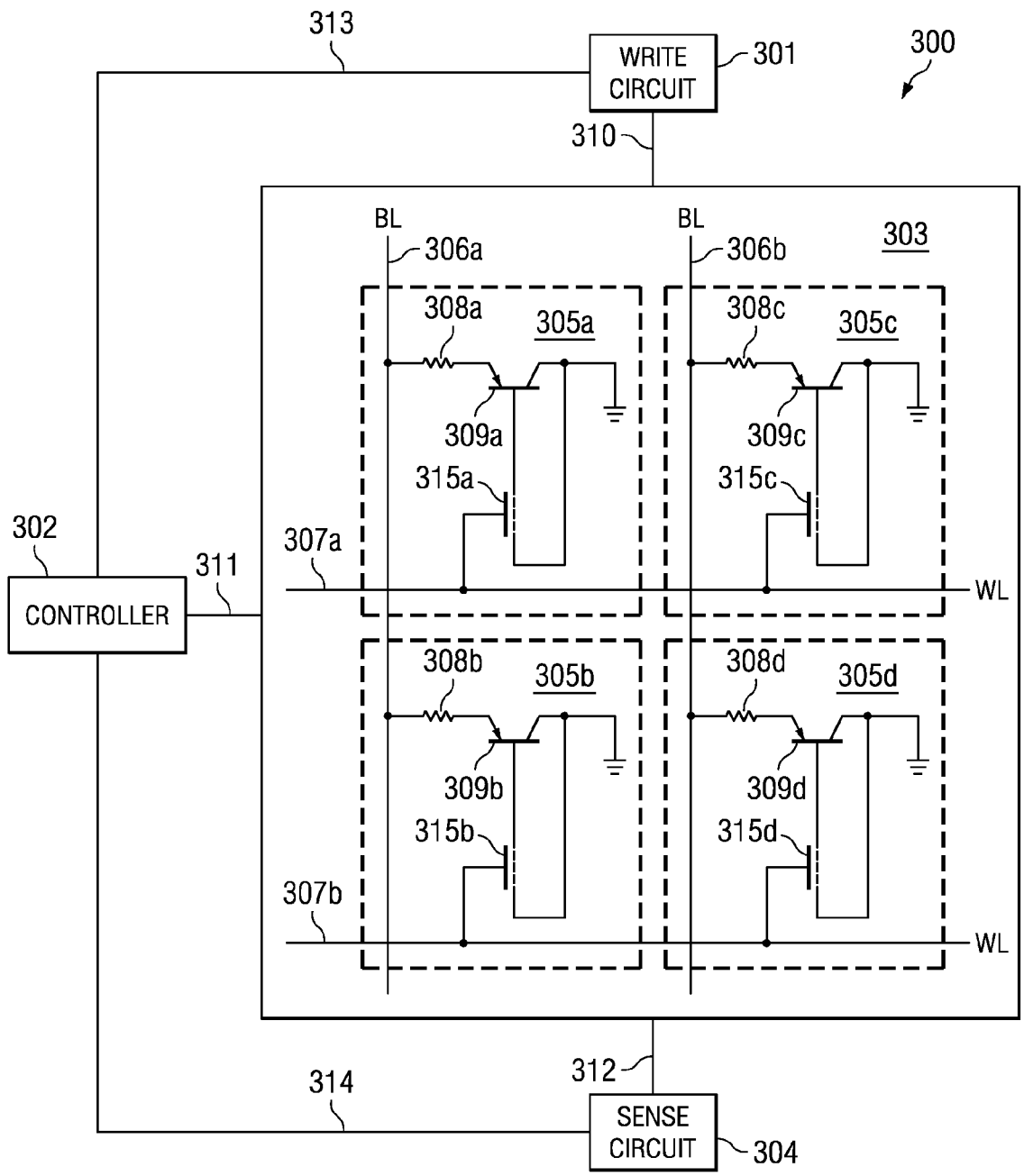
FIG. 3 is a diagram illustrating another embodiment of a memory device.

FIG. 3 illustrates memory device 300, which is another embodiment of memory device 102. Memory device 300 includes a write circuit 301, a controller 302, a memory array 303, and a sense circuit 304. Memory array 303 includes a plurality of resistive memory cells 305a-305d (collectively referred to as resistive memory cells 305), a plurality of bit lines (BLs) 306a-306b (collectively referred to as bit lines 306), and a plurality of word lines (WLs) 307a-307b (collectively referred to as word lines 307). In one embodiment, resistive memory cells 305 are phase change memory cells. In other embodiments, resistive memory cells 305 may be any other suitable type of resistive memory cells or resistivity changing memory cells.

Each memory cell 305 includes a phase change element 308 and a bipolar transistor or diode 309. Bipolar transistors or diodes 309 may be U-shaped and formed in a silicon on insulator (SOI) substrate or local SOI structures between isolation regions. Diodes 309 may be the emitter-base junctions of bipolar PNP transistors. The bipolar transistors may be U-shaped and formed in a substrate having a common potential, such as ground. The bipolar transistors may be formed between isolations regions such that one side of each bipolar transistor is coupled to common or ground. Therefore, the bipolar transistors function similarly to diodes. Diodes or bipolar transistors 309 may be fabricated without selective epitaxy, which requires the use of an ultra-high vacuum chemical vapor deposition (UHV-CVD) tool to meet the temperature budget requirements.

Memory array 303 is electrically coupled to write circuit 301 through signal path 310, to controller 302 through signal path 311, and to sense circuit 304 through signal path 312. Controller 302 is electrically coupled to write circuit 301 through signal path 313 and to sense circuit 304 through signal path 314. Each phase change memory cell 305 is electrically coupled to a word line 307 and a bit line 306. For example, phase change memory cell 305a is electrically coupled to bit line 306a and word line 307a.

Each phase change memory cell 305 includes a phase change element 308, a diode or bipolar transistor 309, and a MOSFET transistor 315. For example, phase change memory cell 305a includes phase change element 308a, diode or bipolar transistor 309a, and MOSFET 315a. One side of phase change element 308a is electrically coupled to bit line 306a, and the other side of phase change element 308a is electrically coupled to one side of diode or bipolar transistor 309a. The other side of diode or bipolar transistor 309a is electrically coupled to MOSFET 315a. Word line 307a acts as the gate of MOSFET 315a.

In one embodiment, each phase change element 308 comprises a phase change material that may be made up of a variety of materials. Generally, chalcogenide alloys that contain one or more elements from Group VI of the periodic table are useful as such materials. In one embodiment, the phase change material is made up of a chalcogenide compound material, such as GeSbTe, SbTe, GeTe, or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

Each phase change element 308 may be changed from an amorphous state to a crystalline state or from a crystalline state to an amorphous state under the influence of temperature change. The amount of crystalline material coexisting with amorphous material in the phase change material of one of the phase change elements thereby defines two or more states for storing data within memory device 300. In the amorphous state, a phase change material exhibits significantly higher resistivity than in the crystalline state. Therefore, the two or more states of the phase change elements differ in their electrical resistance. In one embodiment, the two or more states are two states and a binary system is used, wherein the two states are assigned bit values of "0" and "1". In another embodiment, the two or more states are three states and a ternary system is used, wherein the three states are assigned bit values of "0", "1", and "2". In another embodiment, the two or more states are four states that are assigned multi-bit values, such as "00", "01", "10", and "11". In other embodiments, the two or more states can be any suitable number of states in the phase change material of a phase change element.

Controller 302 may include a microprocessor, microcontroller, or other suitable logic circuitry for controlling the operation of memory device 300. Controller 302 controls read and write operations of memory device 302 including the application of control and data signals to memory array 303 through write circuit 301 and sense circuit 304. In one embodiment, write circuit 301 provides voltage pulses through signal path 310 and bit lines 306 to memory cells 305 to program the memory cells. In other embodiments, write circuit 301 provides current pulses through signal path 310 and bit lines 306 to memory cells 305 to program the memory cells.

Sense circuit 304 reads each of the two or more states of memory cells 305 through bit lines 306 and signal path 312. In one embodiment, to read the resistance of one of the memory cells 305, sense circuit 304 provides current that flows through one of the memory cells 305. Sense circuit 304 then reads the voltage across that one of the memory cells 305. In another embodiment, sense circuit 304 provides voltage across one of the memory cells 305 and reads the current that flows through that one of the memory cells 305. In another embodiment, write circuit 301 provides voltage across one of the memory cells 305 and sense circuit 304 reads the current that flows through that one of the memory cells 305. In another embodiment, write circuit 301 provides current that flows through one of the memory cells 305 and sense circuit 304 reads the voltage across that one of the memory cells 305.

In one embodiment, during a set operation of phase change memory cell 305a, for example, one or more set current or voltage pulses are selectively enabled by write circuit 301 and sent through bit line 306a to phase change element 305a, thereby heating phase change element 308a above its crystallization temperature (but usually below its melting temperature). In this way, phase change element 308a reaches its crystalline state or a partially crystalline and partially amorphous state during this set operation.

During a reset operation of phase change memory cell 305a, for example, a reset current or voltage pulse is selectively enabled by write circuit 301 and sent through bit line 306a to phase change element 308a. The reset current or voltage quickly heats phase change element 308a above its melting temperature. After the current or voltage pulse is turned off, phase change element 308a quickly quench cools into the amorphous state or a partially amorphous and partially crystalline state.

Phase change memory cells 305a-d and other phase change memory cells 305 (not shown) in memory array 303 are set and reset in a manner similar to that described above with respect to phase change memory cell 305a using similar current or voltage pulses. In other embodiments, for other types of resistive memory cells, write circuit 301 provides suitable programming pulses to program the resistive memory cells 305 to the desired state.

Figure 4:
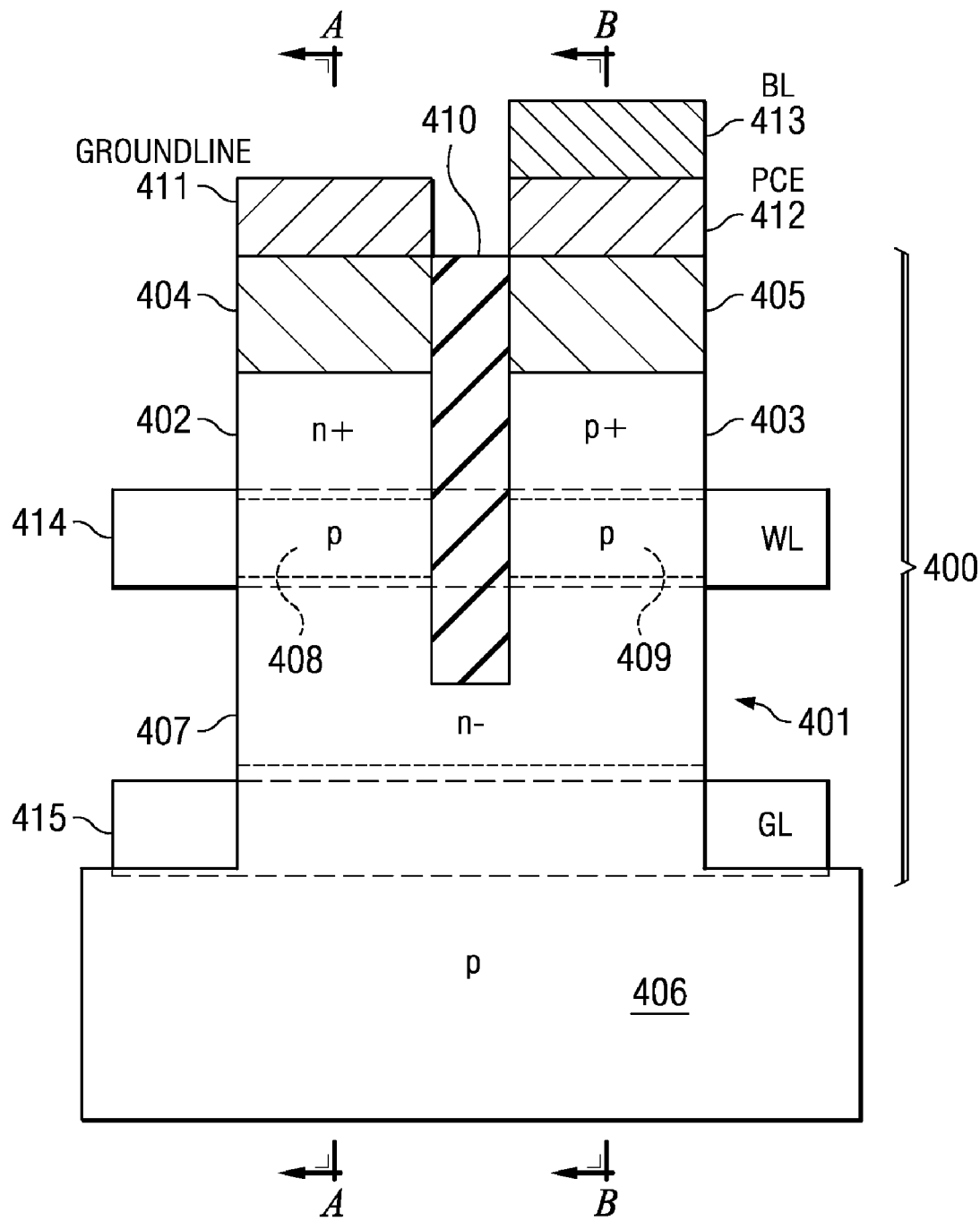
FIG. 4 illustrates a cross-sectional view of one embodiment of a MOSFET driven U-shaped diode access device.

FIG. 4 illustrates a cross-sectional view of one embodiment of a bipolar transistor access device 400. In one embodiment, a U-shaped bipolar transistor access device 400 is used in place of each diode transistor or bipolar transistor 309 and MOSFET 315 described and illustrated with reference to FIG. 3. U-shaped bipolar transistor access device 400 includes a silicon substrate 401, silicon layers or contacts 402 and 403, and contacts or lines 404 and 405. A bipolar transistor is formed in substrate 401, which includes silicon regions 406, 407, 408 and 409. Substrate 401 optionally includes regions 402 and/or 403, or regions 402 and/or 403 may be deposited onto substrate 401.

The bipolar transistor includes a p doped region 406, an n− doped region 407, a p doped region 408, and a p doped region 409. In one embodiment, p doped region 406 is electrically coupled to common or ground 415. The top of p doped region 406 contacts the bottom of n− doped region 407. The top of n− doped region 407 contacts the bottom of p doped region 408 and the bottom of p doped region 409. In one embodiment, p doped region 408 is in the same horizontal plane as p doped region 409 and is isolated from p doped region 409 by dielectric material 410, thereby giving the bipolar transistor a U-shape. In another embodiment, p doped region 408 is not in the same horizontal plane as p doped region 409, but p doped region 408 is still isolated from p doped region 409 by dielectric material 410, thereby maintaining the U-shape of the bipolar transistor. The bipolar transistor may also have a "J" shape in which doped layers 408 and 409 are offset from each other and not formed in the same horizontal plane. In another embodiment, the polarity of the bipolar transistor is reversed, such that region 406 is n doped, region 407 is p− doped, region 408 is n doped, and region 409 is n doped.

The top of p doped region 408 contacts the bottom of n+ doped silicon layer 402. The top of n+ doped silicon layer 402 contacts the bottom of contact or line 404. The top of p doped region 409 contacts the bottom of p+ doped silicon layer 403. The top of p+ doped silicon layer 403 contacts the bottom of contact or line 405. The thickness of n+ silicon layer 402 may be the same thickness as p+ doped silicon layer 403 or a different thickness. The thickness of contact or line 404 may be the same thickness as contact or line 405 or a different thickness. The n+ doped silicon layer 402 and contact or line 404 are separated from p+ doped silicon layer 403 and contact or line 405 by dielectric material 410. In another embodiment, where the polarity of the bipolar transistor is reversed, silicon layer 402 is p+ doped and silicon layer 403 is n+ doped.

In one embodiment, dielectric material 410 is self-aligned between contacts or lines 404 and 405. Dielectric material 410 may comprise one of SiO2, SiOx, SixNy, FSG, BPSG, BSG, a low-K material, or other suitable dielectric material or combination thereof. Contact or line 404 is in contact with a ground line 411, and contact or line 405 is in contact with or coupled to phase change element (PCE) 412. Contacts 404 and 405 and ground line 411 may comprise one of TiN, TaN, W, Al, Ti, Ta, TiSiN, TaSiN, TiAlN, TaAlN, Cu, WN, CoSi, NiSi, NiPtSi, WSi, or a combination thereof, or other suitable electrically conductive material.

PCE 412 is in contact with or coupled to bit line 413. Word line 414 runs behind and/or in front of device 400 and is separated from device 400 by a dielectric material. In one embodiment, word line 414 is constructed so that it is in the same horizontal plane as p doped region 408 and p doped region 409. Word line 414 is formed near p doped region 408 and is separated from p doped region 408 by a dielectric material, such as by a gate oxide material. In one embodiment, word line 414 is oriented perpendicular to bit line 413.

Adjacent devices 400 may be formed in an array. The adjacent devices may be isolated from each other by insulation material, such as SiO2, SiOx, SixNy, FSG, BPSG, BSG, a low-K material, or other suitable dielectric material.

When a voltage is applied to word line 414, a first current may flow from bit line 413 through phase change element 412, contact 405, p+ region 403, p region 409, n− region 407, p region 406 to ground 415; and a second current may flow from bit line 413 through phase change element 412, contact 405, p+ region 403, p region 409, n− region 407, p region 408, n+ region 402, contact 404 to ground line 411.

Figure 5:
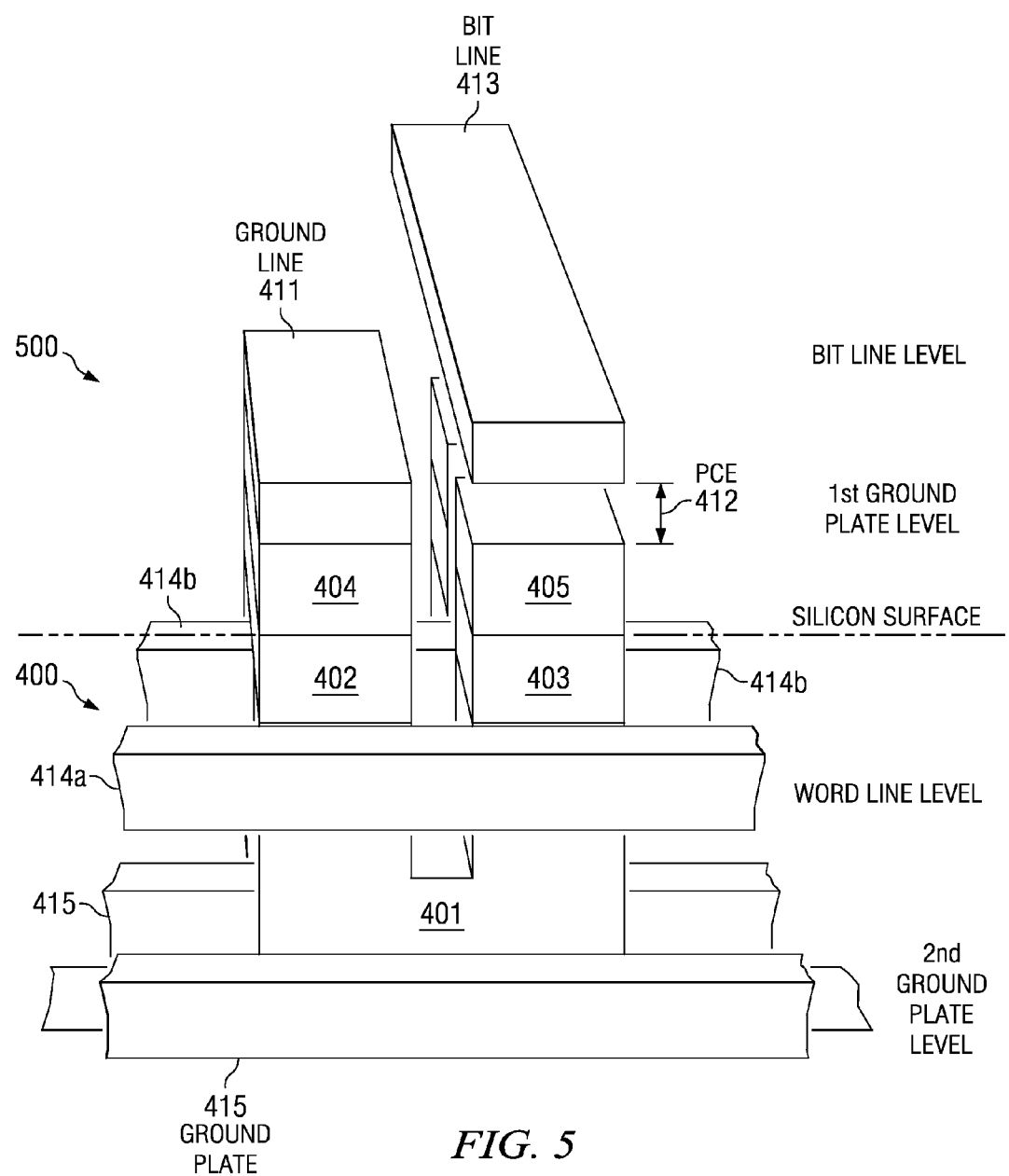
FIG. 5 is a three-dimensional view of one embodiment of a MOSFET driven U-shaped diode access device.

FIG. 5 is a three dimensional view of a U-shaped bipolar transistor access device 500 further illustrating the relationship between bipolar transistor access device 400, word lines 414, bit line 413, ground line 411 and ground line or plate 415. Each bipolar transistor access device 400 may be field coupled to one or more word line 414 as illustrated in FIG. 5 wherein word line 414a passes in front of, and word line 414b passes behind, bipolar transistor access device 400. Multiple bipolar transistor access devices 400 may be arranged in an array to form a memory device, such as array 303 (FIG. 3). An individual bipolar transistor access device 400 in the array is activated when both its respective bit line 413 and word line 414 are pulled to high voltage.

Figure 6:
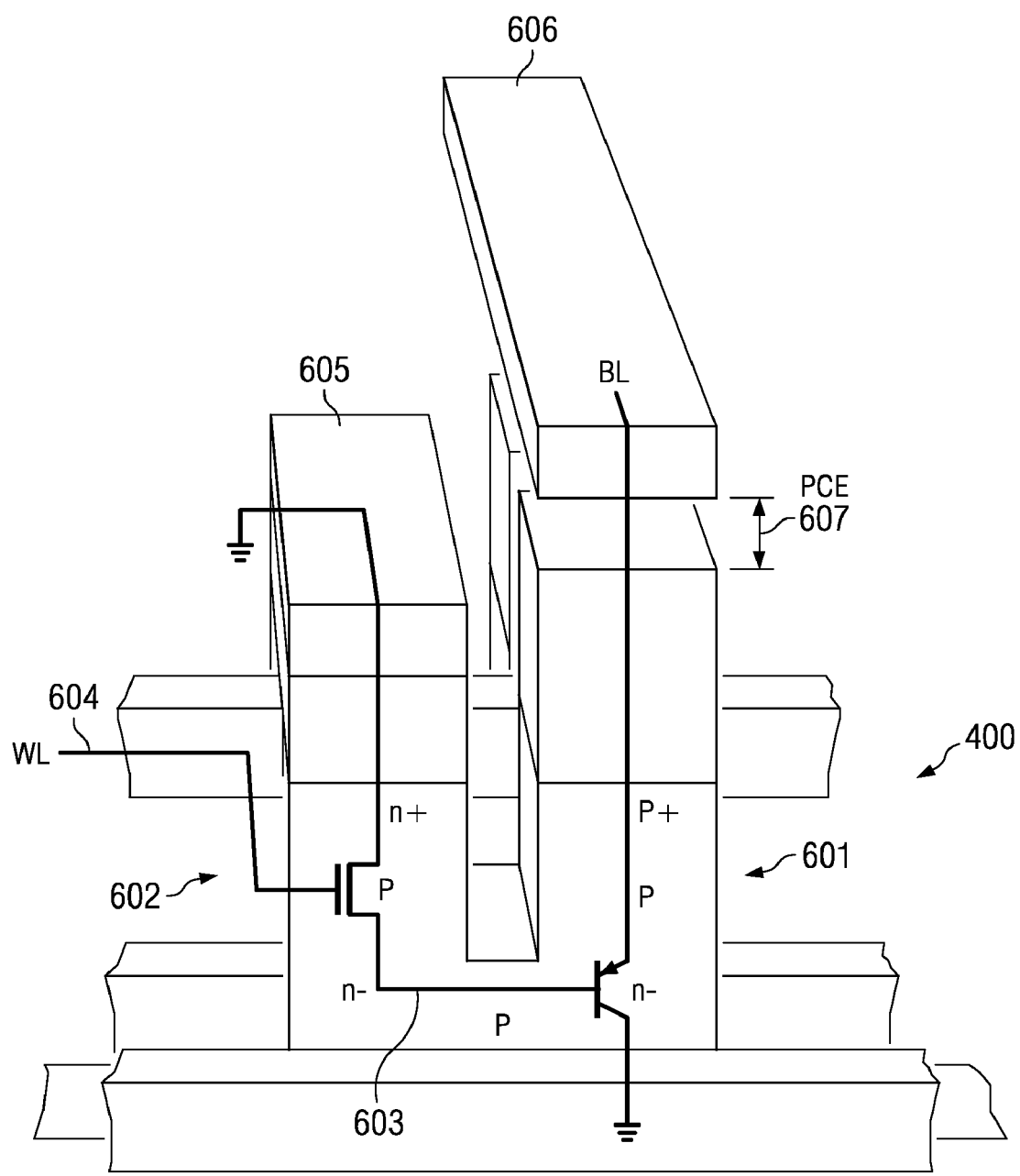
FIG. 6 illustrates the circuit components of one embodiment of a MOSFET driven U-shaped diode access device.

As illustrated in FIG. 6, the legs or sides of U-shaped bipolar transistor access device 400 form a PNP bipolar transistor 601 having base 603. One end of MOSFET transistor 602 is coupled to base 603. When word line 604 is pulled to high voltage, base 603 of PNP bipolar transistor 601 is shorted to ground line 605. If bit line 606 is also pulled to high voltage, then current will flow through transistor 601 and through PCE 607.

Figure 7:
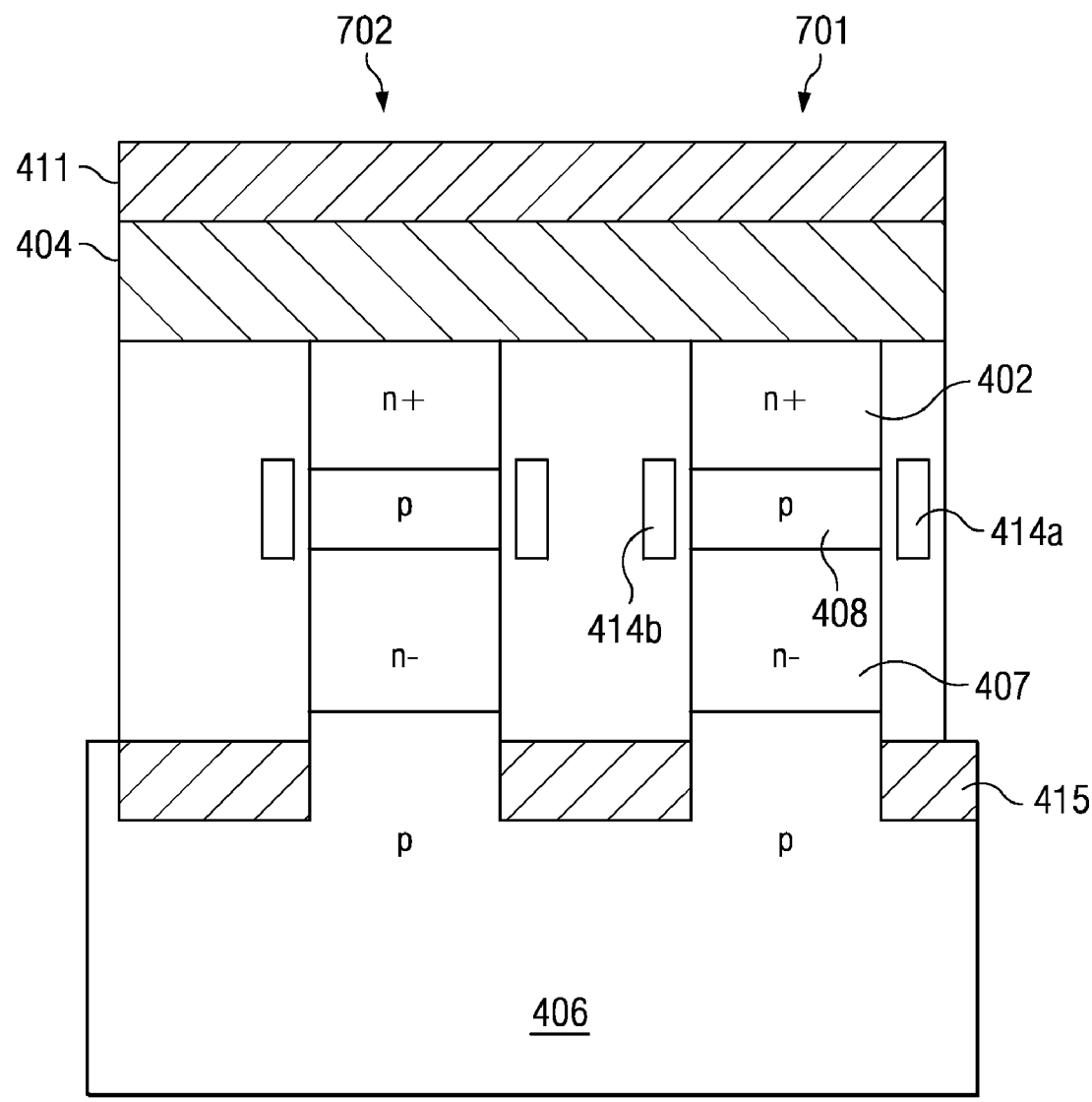
FIG. 7 is a cross-sectional view through line A of FIG. 4.

FIG. 7 illustrates cross-section "A" through the MOSFET leg or side of bipolar transistor access device 400 (FIG. 4). FIG. 7 further illustrates multiple bipolar transistor access devices 701 and 702 constructed in an array. Each of the devices 701, 702 are coupled to ground line 411, which runs perpendicular to word lines 414.

Figure 8:
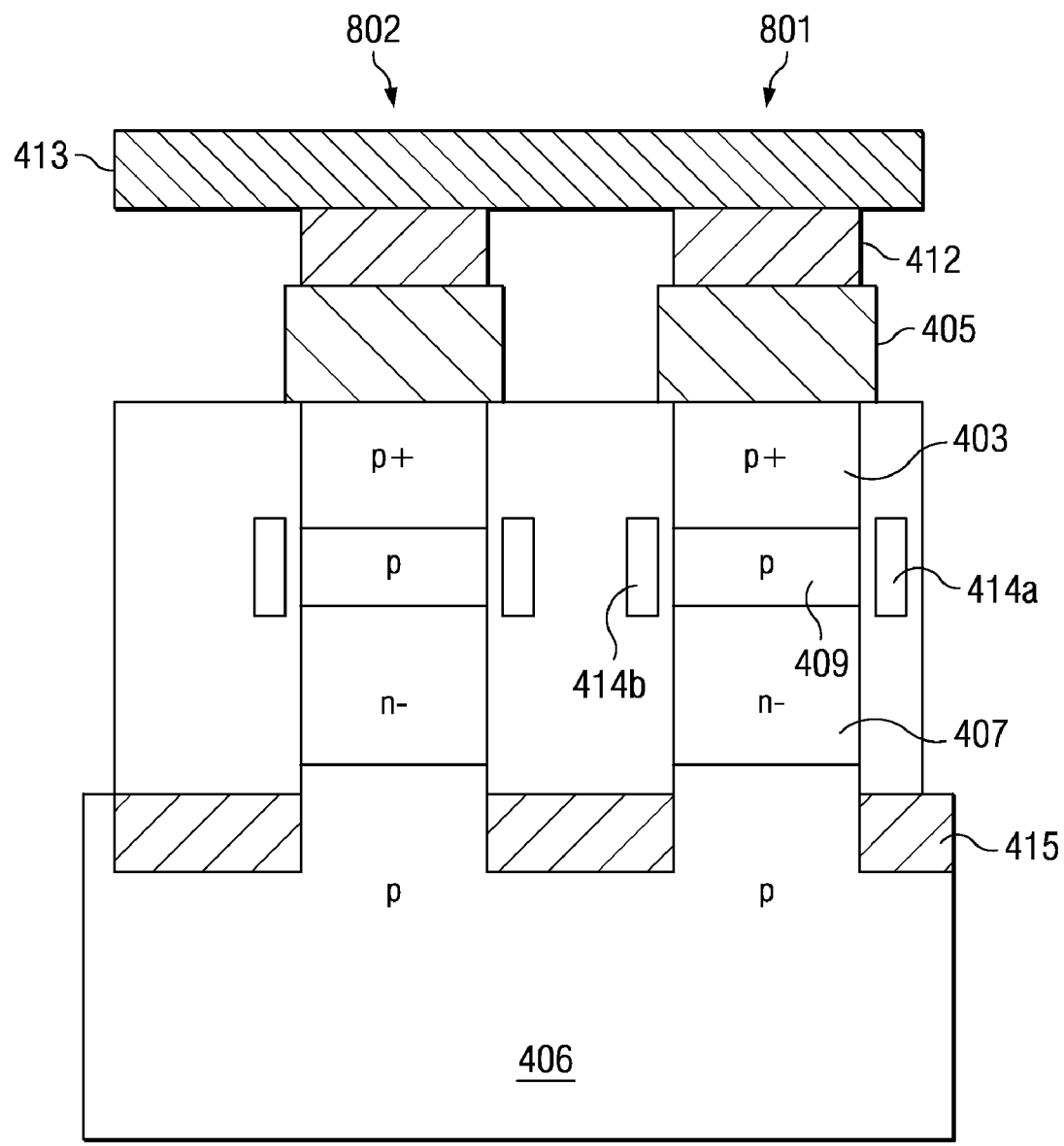
FIG. 8 is a cross-sectional view through line B of FIG. 4.

FIG. 8 illustrates cross-section "B" through the PNP leg or side of bipolar transistor access device 400 (FIG. 4). FIG. 8 further illustrates multiple bipolar transistor access devices 801 and 802 constructed in an array. PNP device 801 has region 407 in common with MOSFET 701, and PNP device 802 has region 407 in common with MOSFET 702. Each of the devices 801, 802 are coupled to bit line 413 by contact 405 and PCE 412. Bit line 413 runs perpendicular to word lines 414 and parallel to ground line 411 (FIG. 4).

In embodiments of the MOSFET driven U-shaped bipolar transistor access device illustrated herein, high voltage levels are not required to drive unselected word lines. Therefore, embodiments of the invention enable low power consumption with high switching capability. The present invention also suppresses cross-talk and interference between word lines.

Exemplary methods for construction the MOSFET driven U-shaped bipolar transistor access device are illustrated in the above-referenced U.S. patent application Ser. No. 12/033,519, filed Feb. 19, 2008, entitled "Integrated Circuit Including U-Shaped Access Device;" and U.S. patent application Ser. No. 12/033,533, filed Feb. 19, 2008, entitled "Integrated Circuit Including U-Shaped Access Device," which applications are hereby incorporated herein by reference. The process in the cited references may be further modified by using a different vertical doping profile in the array and by forming spacer wordlines to operate as the gate of the MOSFET device. One of ordinary skill in the art will understand that other methods of construction are also possible.

While the specific embodiments described herein substantially focused on using phase change memory elements, the embodiments can be applied to any suitable type of resistive or resistivity changing memory elements.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A memory device, comprising
a bipolar junction transistor having an emitter, a base, and a collector;
a first side of a resistance changing memory element coupled to the emitter of the bipolar junction transistor; and
a metal-oxide-semiconductor field-effect transistor (MOSFET) coupled to the base of the bipolar junction transistor,
wherein the bipolar junction transistor and the MOSFET are formed as a U-shaped semiconductor device having a first vertical projection and a second vertical projection, a gate of the MOSFET on the first vertical projection and the emitter of the bipolar junction transistor on the second vertical projection.

2. The memory device of claim 1, further comprising:
a bit line coupled to a second side of the resistance changing memory element; and
a word line coupled to a gate of the MOSFET.

3. The memory device of claim 1, wherein the base of bipolar junction transistor is formed in the same doping area as a source or a drain of the MOSFET.

4. The memory device of claim 1, wherein the MOSFET is an n-channel MOSFET, and wherein the bipolar junction transistor is a PNP transistor.

5. The memory device of claim 1, wherein the MOSFET is a p-channel MOSFET, and wherein the bipolar junction transistor is an NPN transistor.

6. A memory device, comprising:
a resistance changing memory element coupled to a first side of a U-shaped access device; wherein the U-shaped access device further comprises:
a doped first region having a first polarity;
a doped second region disposed above the first region, the doped second region having a second polarity;
a doped third region disposed above a first portion of the second region, the third region having the first polarity;
a doped fourth region disposed above the third region, the fourth region having the second polarity; and
a doped fifth region disposed above a second portion of the second region, the fifth region having the first polarity.

7. The memory device of claim 6, further comprising:
a heavily doped sixth region disposed above the fifth region, the sixth region having the first polarity.

8. The memory device of claim 6, wherein the first, third, and fifth regions are p-doped regions, and wherein the second and fourth regions are n-doped regions.

9. The memory device of claim 6, further comprising:
a ground line coupled to the fourth region.

10. The memory device of claim 7, further comprising:
a phase changing element coupled to the sixth region.

11. The memory device of claim 10, further comprising:
a bit line coupled to the phase changing element.

12. The memory device of claim 6, further comprising:
a word line formed near the third region, the word line isolated from the third region by a dielectric.

13. The memory device of claim 6, further comprising:
a ground line coupled to the first region.

14. The memory device of claim 6, wherein the first, second and fifth regions form a bipolar junction transistor; and wherein the second, third, and fourth regions and the word line form a MOSFET transistor.

15. The memory device of claim 14, wherein the bipolar junction transistor is a PNP transistor, and wherein the MOSFET transistor is an n-channel MOSFET transistor.

16. The memory device of claim 6, further comprising:
a word line formed near the third region and separated from the third region by a dielectric material;
a phase changing element coupled to the fifth region;
a bit line coupled to the phase change region; and
wherein, when a voltage is applied to the word line, a first current flows from the bit line to the first region through the phase change element, and a second current flows from the from the bit line to at least one ground line located above the fourth region.

17. The memory device of claim 6, wherein the second region is lightly doped and the fourth region is heavily doped.

18. A method for fabricating an integrated circuit, comprising:
doping a first region of a substrate to have a first polarity;
lightly doping a second region of the substrate to have a second polarity, a bottom of the second region contacting a top of the first region;
doping a third region of the substrate to have the first polarity, a bottom of the third region contacting a first portion of a top of the second region;
heavily doping a fourth region to have the second polarity, a bottom of the fourth region contacting a top of the third region;
doping a fifth region of the substrate to have the first polarity, a bottom of the fifth region contacting a second portion of the top of the second region; and heavily doping a sixth region to have the first polarity, a bottom of the sixth region contacting a top of the fifth region.

19. The method of claim 18, further comprising:
isolating the third and fourth regions from the fifth and sixth regions.

20. The method of claim 18, wherein fabricating the integrated circuit further comprises:
fabricating a bipolar transistor in a silicon substrate; and
fabricating a MOSFET transistor in the silicon substrate.

21. The method of claim 18, further comprising:
fabricating a phase change element on a top of the sixth region;
fabricating a first line coupled to phase change element; and
fabricating a second line coupled to the third region.

* * * * *